United States Patent [19]

Leung et al.

[11] Patent Number: 5,138,189
[45] Date of Patent: Aug. 11, 1992

[54] ASYNCHRONOUS STATE MACHINE SYNCHRONIZATION CIRCUIT AND METHOD

[75] Inventors: Frederick Kwok-Yin Leung, Cupertino; Richard D. Henderson, Sunnyvale, both of Calif.

[73] Assignee: National Semiconductor, Santa Clara, Calif.

[21] Appl. No.: 588,696

[22] Filed: Sep. 27, 1990

[51] Int. Cl.⁵ .................... H03K 17/18; H03K 3/27
[52] U.S. Cl. .................. 307/272.1; 307/443; 307/269; 307/480
[58] Field of Search .............. 307/443, 269, 272.1, 307/272.2, 480, 572, 291, 279; 328/150, 151, 155; 371/57.1, 57.2

[56] References Cited

U.S. PATENT DOCUMENTS

| | | | |
|---|---|---|---|
| 3,761,739 | 9/1973 | East et al. | 307/443 |
| 4,282,489 | 8/1981 | De Rienzo | 307/291 |
| 4,544,851 | 10/1985 | Conrad et al. | 307/269 |
| 4,591,737 | 5/1986 | Campbell | 307/443 |
| 4,800,296 | 1/1989 | Ovens et al. | 307/443 |
| 4,835,442 | 5/1989 | Dike et al. | 307/443 |
| 4,963,772 | 10/1990 | Dike | 307/272.1 |
| 4,982,118 | 1/1991 | Lloyd | 307/480 |

OTHER PUBLICATIONS

"The Art of Electronics" by Horowitz et al, Cambridge Univ. Press, 1980, p. 341.
*Introduction to VLSI Systems*, 1980 by Carver Mead and Lynn Conway, pp. 260-261.

*Primary Examiner*—Stanley D. Miller
*Assistant Examiner*—Toan Tran
*Attorney, Agent, or Firm*—Limbach & Limbach

[57] ABSTRACT

A circuit for sampling a digital input signal utilizing an asynchronous strobe signal and a method for such synchronization are disclosed. The circuit includes an input storage element, such as a latch, which stores the input signal upon receipt of a strobe signal. There is a possibility that the input storage element will become temporarily metastable, with the output of the element being indeterminate, should the digital input signal change levels at substantially the time that the strobe signal is received. The subject synchronization circuit includes circuitry which senses when the input storage element is metastable and gating circuitry which produces a synchronized signal after receipt of the strobe signal, provided the input storage element is not metastable. The synchronized signal can then be used to clock the stored input signal.

15 Claims, 5 Drawing Sheets

ASYNCHRONOUS STATE MACHINE SYNCHRONIZATION CIRCUIT AND METHOD

BACKGROUND OF THE INVENTION

1. Field of the Invention

The subject invention relates generally to the field of signal processing and more particularly to circuits and methods of synchronizing digital signals.

2. Description of Related Art

In a signal processing environment, it is often necessary to transfer data between two systems having unrelated clocks. By way of example, an asynchronous system such as a state machine typically operates on outside signals which have no timing relationship to the system. In most cases, the outside signals are temporarily stored in a bistable circuit such as a flip-flop, latch or register. The bistable circuit is clocked by a strobe signal which is synchronous with the state machine but not necessarily with the outside signal.

Bistable circuits and other forms of binary storage devices have outputs which assume either one of two stable states. The outputs are either a low logic level, sometimes arbitrarily referred to as a logic "0" and a high logic level, sometimes arbitrarily referred to as a logic "1". However, bistable circuits, which usually rely on some form of internal feedback, are capable of entering an additional state, intermediate the two stable states, commonly referred to as the metastable state. Bistable circuits have the greatest probability of entering the metastable state when the input to the circuit is changing substantially at the same time the input is being stored. For example, if the bistable circuit is a clocked D type flip-flop, the flip-flop may enter the metastable state should the flip-flop be clocked substantially at the same time the input is changing. When in the metastable state, the flip-flop output may assume an intermediate level, between a logic "1" and a "0". The flip-flop may also oscillate between the two stable states. Theoretically, the flip-flop may remain in the metastable state indefinitely. However, an actual flip-flop will eventually leave the metastable state and assume a stable state, either a logic "1" or "0".

Circuits have been utilized to minimize the effects of metastability in binary storage devices, since such effects are likely to produce system errors. One such circuit, depicted in FIG. 1, functions to transfer an input signal to an asynchronous state machine (not depicted).

The state machine periodically samples various data input from an external source and responds to such inputs in a predetermined manner. The inputs are asynchronous with the state machine. The synchronizing circuit includes a pair of cascaded D-type flip-flops 10 and 12, the first of which receives one of the external input signals. Flip-flop 10 is clocked by a clock signal labeled Exit State which is provided by the state machine.

The Exit State signal, which is asynchronous with respect to the input signal, is produced when the state machine has completed the processing of the last set of input data and is ready to process additional input data.

The input signal is transferred to the Q output of flip-flop 10 upon the occurrence of the Exit State signal. The Q output will hold or store the signal until a subsequent Exit State signal is produced. In the event the input signal changes states at substantially the same time the Exit Signal is produced, there is an increased probability that flip-flop 10 will enter a metastable state.

The FIG. 1 circuit includes a fixed delay circuit 14 which delays the Exit State signal a predetermined period of time. The delay duration is selected to exceed the maximum period in which flip-flop 10 is likely to remain in a metastable state. The period is a function of the fabrication technology of flip-flop 10 as well as the circuit design of the flip-flop, with a typical maximum period being on the order of 25 to 100 nanoseconds.

The output of delay circuit 14 is used to clock the second flip-flop 12. Delay circuit 14 prevents flip-flop 12 from being clocked until flip-flop 10 has had sufficient time to exit a metastable state. The output of circuit 14 is also used as a Set Next State signal to be used by the state machine for sampling the output of flip-flop 12, such output being identical to the input signal at the time the Exit State signal was produced.

Although the FIG. 1 circuit will greatly reduce the likelihood of producing an error due to metastability of flip-flop 10, the circuit possesses at least one serious shortcoming. Flip-flop 10 is not likely to become metastable for the vast majority of input signals. However, delay circuit 14 will always produce a fixed delay, whether such delay is required or not. Thus, the speed at which the state machine can receive and process new data is significantly reduced.

The present invention overcomes the above-noted limitations of prior art synchronization circuits. Asynchronous signals can be sampled with minimum delay while maintaining a very low probability of system error. These and other advantages of the present invention will become apparent to those skilled in the art upon a reading of the following Description of the Preferred Embodiments together with the drawings.

SUMMARY OF THE INVENTION

A circuit and method for synchronizing a plurality of input signals with a strobe signal which is asynchronous with respect to the input signals. A storage circuit means, such as a latch, is provided for each of the input signals for storing an output signal indicative of the input signal is included in the synchronizing circuit. The storage circuit means may be either in a stable or metastable state associated input signal is initially stored.

The synchronization circuit further includes means for detecting when the storage circuit means is in the stable state. In the event the storage circuit means includes a pair of outputs which are complementary when the storage circuit means is in a stable state, the means for detecting compares the relative magnitudes of the two outputs.

Gate means are further included in the synchronization circuit which produce an output synchronized signal. The gate means is responsive to the strobe signal and detect means and functions to produce the synchronized signal only when all of the storage circuit means are in the stable state.

DESCRIPTION OF THE PREFERRED EMBODIMENT

Figure 2:
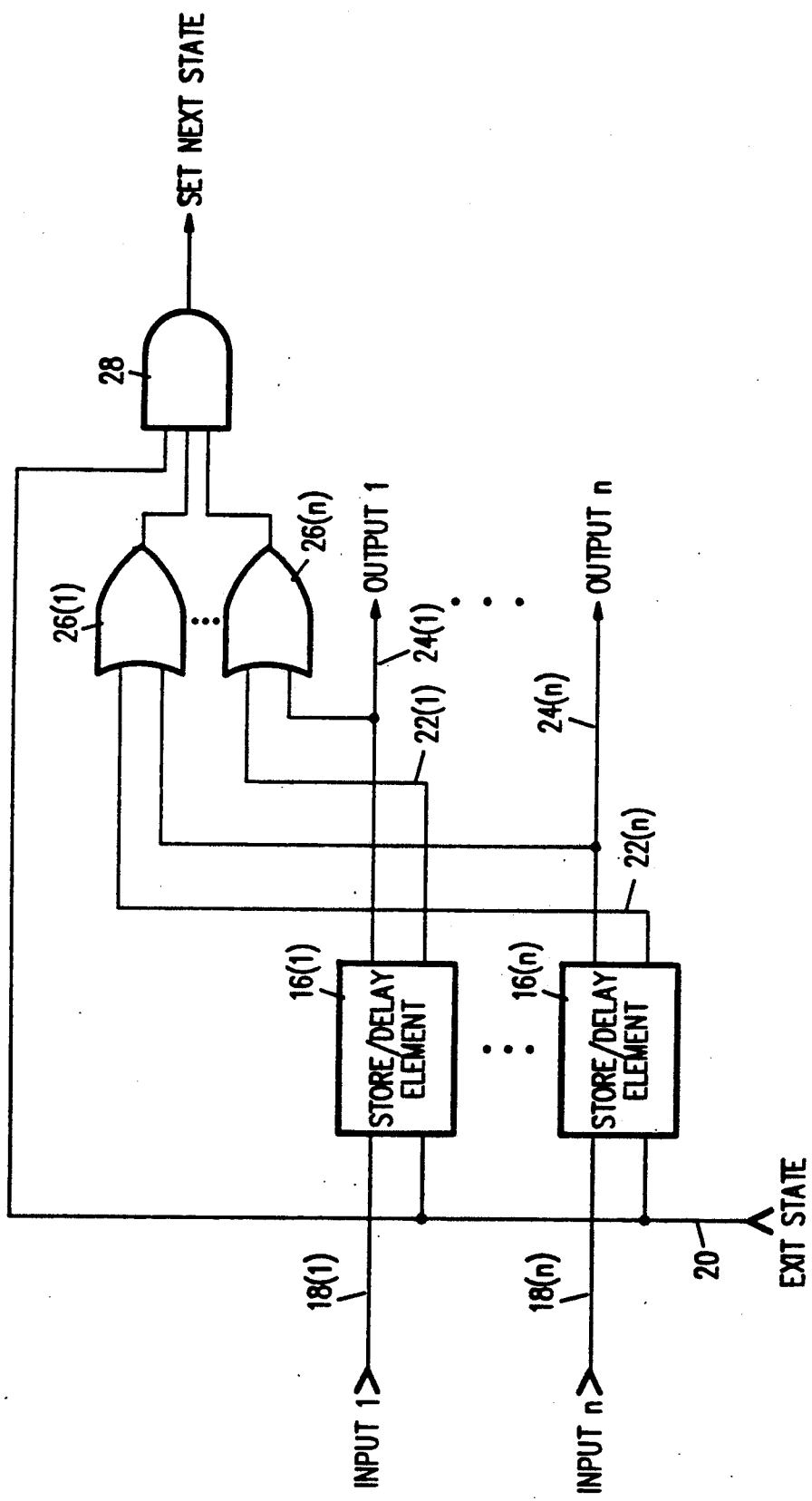
FIG. 2 is an overall block diagram for synchronizing n number of input signal with an asynchronous strobe signal.

Referring now to the drawings, FIG. 2 shows a simplified schematic diagram of the subject invention. The state machine (not depicted) is configured to receive a plurality of input signals, including signals Input 1 through Input n. Each input signal is coupled to one input of a separate store/delay element 16 by way of line 18. The remaining input of each store/delay element 16 is coupled to a strobe signal called Exit State by way of line 20. The Exit State signal is produced by the state machine when the state machine is ready to receive updated inputs. The Exit State signal is asynchronous with respect to the signals Input 1 through Input n.

As will be subsequently described in greater detail, the function of the store/delay elements 16 is to store the corresponding input signal upon receipt of the asynchronous signal Exit State. Elements 16 also function to provide a delayed output in the event the internal bistable circuit (not depicted) of the element enters a metastable state.

Each store/delay element 16 has two outputs on lines 22 and 24, respectively. Line 24 carries the stored output signal which corresponds to the input signal on line 18. The second output on line 22 is normally the complement of the output on line 24. However, should the internal bistable element enter a metastable state, both outputs on lines 22 and 24 will remain at logic low levels. Once the bistable exits the metastable state, the two outputs will return to the normal complementary states.

The outputs of the store/delay elements 16 are coupled to the inputs of separate OR gates 26. The outputs of OR gates 26 are coupled to the inputs of an AND gate 28. In addition, a remaining AND gate input is coupled to line 20 which carries the asynchronous Exit State signal. Accordingly, AND gate 28 will generate signal Set Next State upon receipt of signal Exit State, provided none of the internal bistable circuits of elements 16 are in a metastable state. If one or more of the circuits is in the metastable state, the output of the associated OR gate 26 will remain a logic low thereby disabling AND gate 28. Once the metastable state is exited, AND gate 28 will be enabled. This causes the Set Next State signal to be produced so as to permit the state machine to sample the stored outputs signals on lines 24(1)-24(n).

Figure 4A:
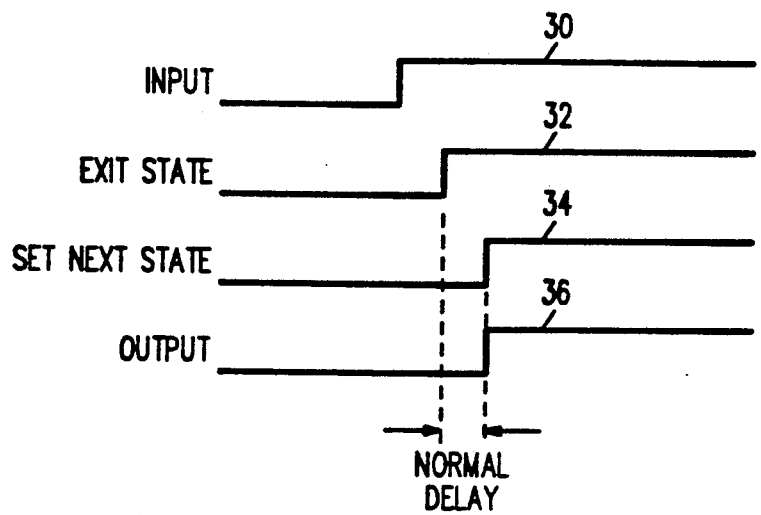
FIGS. 4A-4C depict timing diagrams illustrating the operation of the FIG. 2 circuit.
Figure 4B:
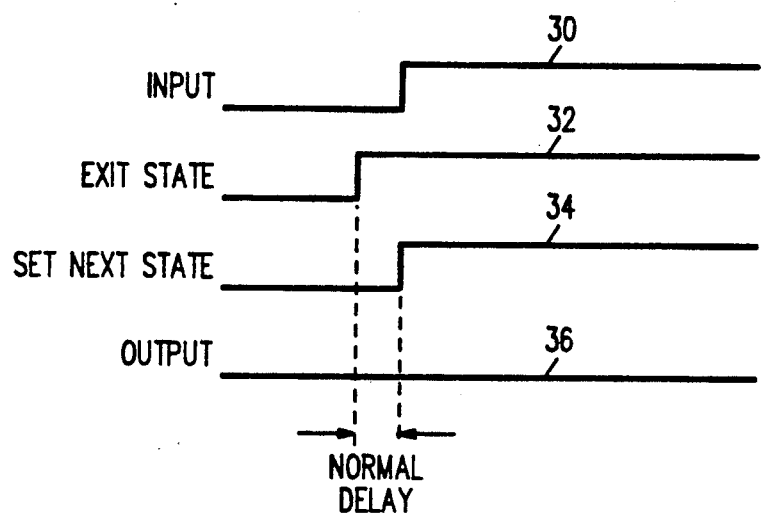
Figure 4C:
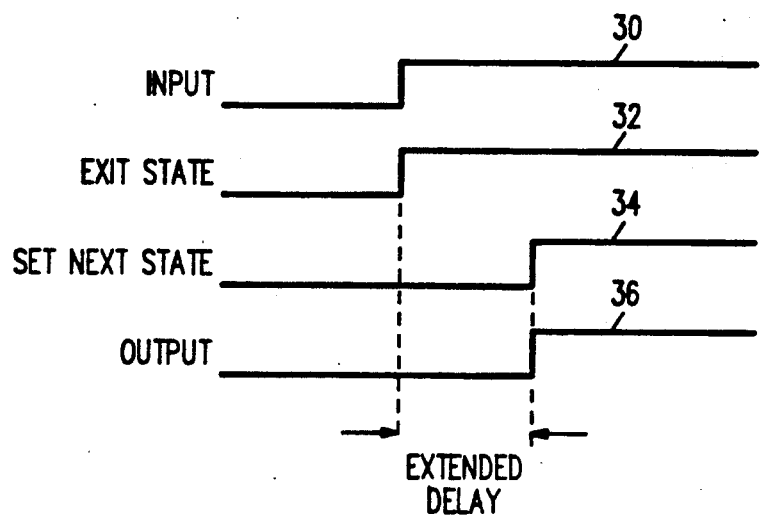

The timing diagram of FIG. 4A-4C can be used to further explain the operation of the FIG. 2 circuit. The diagrams are not drawn to scale so as to simplify the explanation of the circuit. Referring to FIG. 4A, waveform 30 represents an exemplary one of the signals Input 1 through Input n generated on lines 18(1) through 18(n) (FIG. 2) and waveform 32 represents the asynchronous Exit State signal on line 18. Since the signal Exit State changes levels subsequent to the change in state of the signal Input, the internal bistable circuit will not become metastable. In that event, the store/delay element 16 will produce a signal Output as represented by waveform 36 which corresponds to signal Input.

In addition, the complementary output of the store/delay circuit 16 will cause the associated OR gate 26 to enable gate 28 (assuming that the other elements 16 are also stable) thereby allowing signal Exit State to produce the signal Set Next State represented by waveform 36. The delay between the signal Exit State (waveform 32) and the Set Next State and Output signals (waveform 34) is attributable to the normal propagation delays through the circuitry.

FIG. 4B shows the various waveforms when one of the signals Input (waveform 30) changes level prior to receipt of the asynchronous signal Exit State (waveform 32). The signal Output (waveform 36) remains low since signal Input was low when signal Exit State was produced. In addition, the internal bistable circuit will not become metastable therefore the signal Set Next State (waveform 34) will be produced after a normal propagation delay.

FIG. 4C shows the operation of the circuit when the signal Input (waveform 30) changes state substantially simultaneously with receipt of the signal Exit State (waveform 32). There is a significant probability that the internal bistable circuit will enter the metastable state for a period of time.

As can be seen by waveform 34 of FIG. 4C, the bistable circuit will eventually exit the metastable state when the output of the pertinent store/delay element 16 becomes complementary. At this point, signal Set Next State (waveform 34) will be produced. The extended delay between the signal Exit State and signal Set Next State includes the normal propagation delay plus the time period in which the bistable circuit is metastable. The signal Output (waveform 36) is also produced after the extended delay. Since the signal Input was changing state when the signal Exit State was received, there would be an equal probability that the signal Output would be low level instead of the high level signal depicted by waveform 76.

Figure 3:
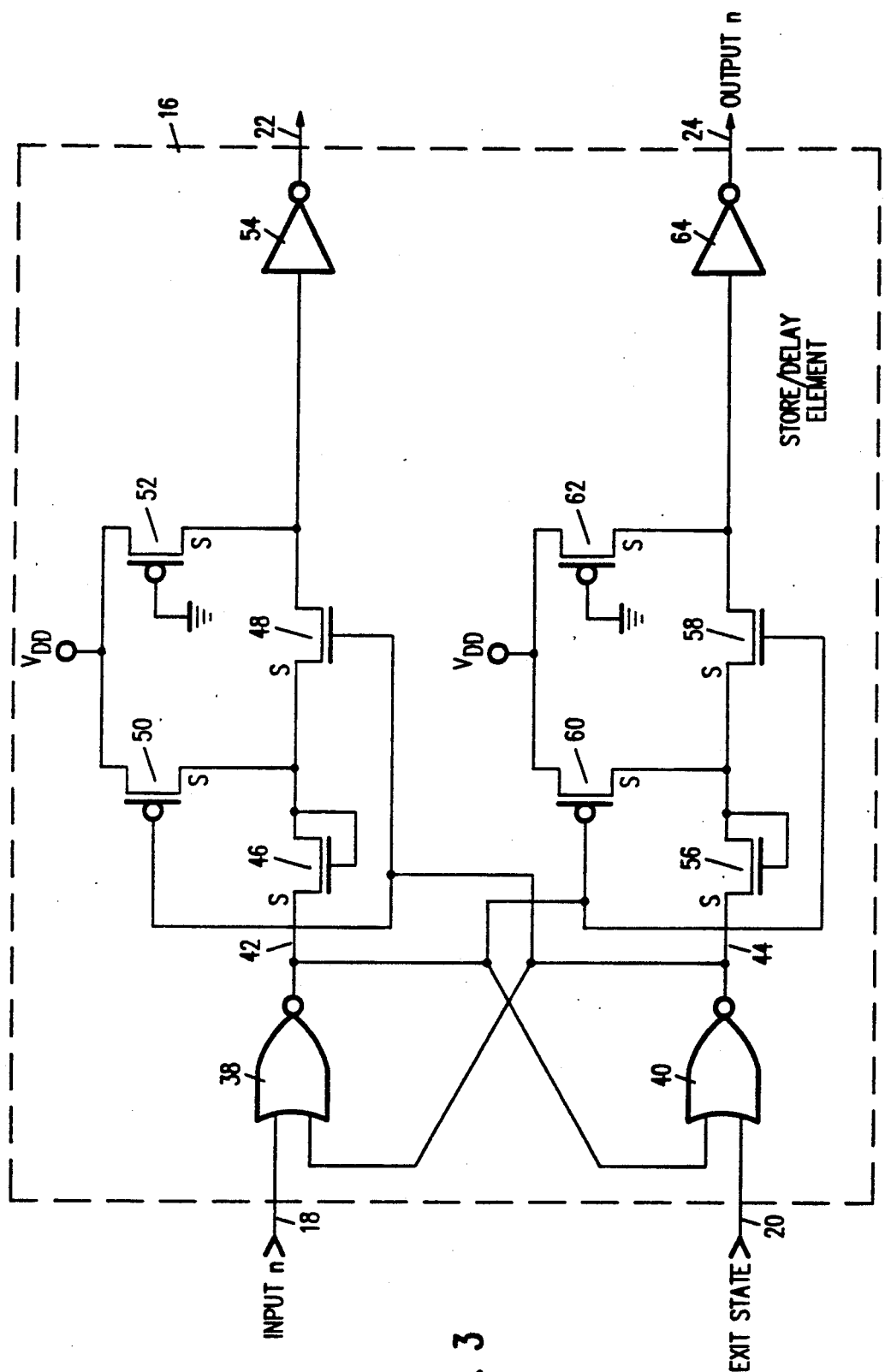
FIG. 3 is a detailed schematic diagram of a store/-delay element which eliminates errors due to internal metastable conditions and which can be used in the FIG. 2 sampling system.

The details of the construction of one embodiment of the store/delay element 16 are shown in FIG. 3. It should be noted at this point that element 16 was previously described as having inputs in the form of signal Input and the signal Exit State which are normally low and which go high when the signals change states. The element was described in this manner for purposes of simplification. The actual circuit is implemented such that the two input signals are normally high and go low when the signals change state.

Element 16 is implemented using standard CMOS fabrication technology. The element includes a pair of NOR gates 38 and 40, each of which is constructed as a standard logic element. Gate 38 has two inputs, one of which receives the normally high signal Input on line 18 and the other of which is connected to the output 44 of NOR gate 40. Gate 40 also has two inputs, including one input which receives the normally high signal Exit State on line 20 and the other of which is connected to the output 42 of OR gate 38.

Gates 38 and 40 operate together to form a latch circuit, this circuit being a particular type of storage element. The latch circuit functions to store signal Input at output 42 of gate 38 in inverted form. Gate 40 functions to prevent the stored signal at the output of gate 38 from changing state despite changes in the signal Input, once the signal Exit State is produced by going low.

The latch formed by gates 38 and 40 is capable of entering a metastable state, particularly when signals Input and Exit State go low substantially simultaneously. A principal function of the remainder of the circuitry of the store/delay element 16 is to sense when the latch is in a metastable state and to hold the output signals on lines 22 and 24 low during that state. The remaining circuitry also functions to transfer the complementary outputs 42 and 44 of the latch to lines 22 and 24 when the latch is neither metastable nor in the idle mode, as will be described.

The output 42 of gate 38 is coupled to the input of a standard CMOS inverter circuit 54 by way of two N channel MOS transistors 46 and 48. The source electrode of transistor 46 is connected to output 42 and the gate and drain electrodes are connected together and to the source electrode of transistor 48. The gate electrode of transistor 48 is connected to the output 44 of OR gate 40 and the drain electrode is connected to the input of inverter 54. The output of inverter 54 is connected to line 22.

Two P channel MOS transistors 50 and 52 are also included having their drain elements connected to the positive supply voltage $V_{DD}$. The source electrode of transistor 50 is connected to the node intermediate transistors 46 and 48 and the source electrode of transistor 52 is connected to the node intermediate transistor 48 and inverter 54. The gate electrode of transistor 50 is connected to the output 44 of gate 40 and the gate electrode of transistor 52 is connected to ground.

Element 16 further includes N channel MOS transistors 56 and 58 which are configured in the same manner as transistors 46 and 48, respectively. In addition, P channel MOS transistors 60 and 62 are included which are configured in the same manner as transistors 50 and 52, respectively. Finally, a standard inverter circuit 64 is provided which corresponds to inverter 54. The output of invertor 64 is connected to line 24 which carries signal Output n.

Transistors 46, 48, 56 and 58 and the output transistors of OR gates 38 and 40 (not depicted) are relatively large geometry devices. Transistors 50, 52, 60 and 62 are relatively small geometry devices, approximately one half the size of the large geometry devices.

Operation of the store/delay element 16 will now be described. Assume initially that the element is in an idle state, this being the state when both signal Input and signal Exit State at the normally high logic level. In that event, the outputs 42 and 44 of OR gates 38 and 40, respectively, will be at logic low levels.

Transistors 46 and 48 will become conductive only if the gate-to-source voltage applied to the devices exceeds the turn on threshold voltage of approximately 1 volt. Since the gate voltage of transistor 48 is connected to the low output 44 of gate 40, the N channel transistor 48 will be off. With transistor 48 turned off, P channel transistor 52 will be conductive since the gate electrode is connected to ground. Transistor 52 will pull the input of inverter 54 up to a high logic level so that the signal on line 22 will be at a low logic level.

Since the gate voltage of N channel transistor 58 is connected to output 42 of OR gate 38 it will also be at a low logic level, and will also be nonconductive. The gate electrode of P channel transistor 62 is connected to ground and will be, therefore, conductive. Transistor 62 will pull the input of inverter 64 to a high logic level so that the output of inverter 64 on line 24 will also be at a low logic level.

If transistors 50 and 60 were deleted, transistor 46, 48, 56 and 58 would be turned off in the idle state. The node between transistors 46 and 48 and between 56 and 58 would be at a high impedance and the voltage of the node would be indeterminate. To avoid this condition and the possible switching distortion which would result, transistors 50 and 60 have been added. With the gate voltage of transistors 50 and 60 at a low level, both transistors are conductive and pull the gate and drain elements of transistors 46 and 56 respectively, up to a high logic level. This will cause transistors 46 and 56 to be conductive when element 16 is in the idle mode so that the node between transistors 46 and 48 and between transistors 56 and 58 will be a low impedance and a known voltage level.

Thus, when in the idle state, both inputs to the store/delay element 16 are at high logic levels and the output on lines 22 and 24 are both at low logic levels. The associated OR gate 26 (FIG. 2) will be disabled and there will be no signal Set Next State.

Assume that the state machine generates a signal Exit State, which causes the signal on line 20 to momentarily go from a high logic level to a low logic level. This signal is produced by the state machine when it is ready to sample the high signal Input on line 18. Since the output 42 of gate 38 will remain low, both inputs to gate 40 will be low thereby causing the output 44 to go high.

The low output 42 of gate 38 will continue to hold the gate electrode of transistor 58 low. Transistor 58 will remain turned off and the signal Output on line 24 will remain low.

The source electrode of transistor 46 will be held low by the output 42 of gate 38 and the gate electrode of transistor 48 will be held at a logic high level. The difference in logic levels will exceed the sum of the gate-to-source threshold voltages of transistors 46 and 48, the sum being two volts. Accordingly, both transistors 46 and 48 will turn on.

Since the output transistors of gate 38 (not depicted) and transistors 46 and 48 are large geometry transistors, gate 38 will have sufficient drive capability to overcome conductive transistor 52. The gate output 42 will pull the input of inverter 54 to a low level through transistors 46 and 48. Accordingly, the output of inverter 54 will change to a logic high level.

The complementary outputs of element 16 on lines 22 and 24 will be received by the associated OR gate 26 (FIG. 2), thereby enabling AND gate 28 so that signal Set Next State will be produced. This signal will be used by the state machine to sample signal Output on line 24.

Assume that signal Input was low when the Exit State signal goes from a high to a low state. Under these conditions, the output 42 of gate 38 will be at a logic high level and the output 44 of gate 40 will be at a logic low level. The difference in logic levels will cause transistors 56 and 58 to be conductive so that the input of the inverter 64 will be at a low level and signal Output on line 24 will be high. Transistor 48 will be off thereby permitting transistor 52 to pull the input of inverter 45 to a high logic level. This will cause the output signal on line 22 will be low.

The complementary outputs of element 16 on lines 22 and 24 will cause the associated OR gate (FIG. 2) to enable AND gate 28. Gate 28 will then produce the signal Set Next State which will be used by the state machine to sample the signal Output.

It can be seen that under normal operating conditions, the store/delay element 16 will store the signal Input. The element will also produce a signal Output which corresponds to the signal Input on line 24 and the complement of the signal Output on line 22. The small delay in producing the complementary output signals will be equal to the propagation delay through the element.

The latch comprised of gates 38 and 40 is most vulnerable to entering the metastable state when the signal Input happens to change state at substantially the same time as asynchronous signal Exit State. In that event, the outputs 42 and 44 of gates 38 and 40 are likely to be at intermediate states rather than logic low or high states. It is also possible that one gate output will be at an intermediate level and the other output will oscillate about the intermediate level.

In normal operation, once the signal Exit State is produced and the element has left the idle mode, the outputs 42 and 44 of the NOR gates will be complementary and will differ in magnitude by significantly more than 2 volts, assuming that the positive supply voltage $V_{DD}$ is at approximately 5 volts. However, when the latch is in the metastable state, the difference in the two gate output voltages will almost always be less than 2 volts. There will be insufficient voltage to turn on either series-connected transistors 46 and 48 or series-connected transistors 56 and 58. As a consequence, transistors 52 and 62 will both be free to pull the input to the associated invertor 56 and 64 high so that the signals on line 22 and 24 will both be low. In this mode, the associated OR gate 26 (FIG. 2) output will be low and will prevent the signal Set Next State from being generated.

Eventually, the latch will become stable and the outputs 42 and 44 will assume opposite logic levels. Either line 22 or line 24 will go high, thereby enabling the associated OR gate 26 (FIG. 2). At that time, the signal Set Next State will be produced, indicating to the state machine that the input data are ready for sampling.

Figure 5:
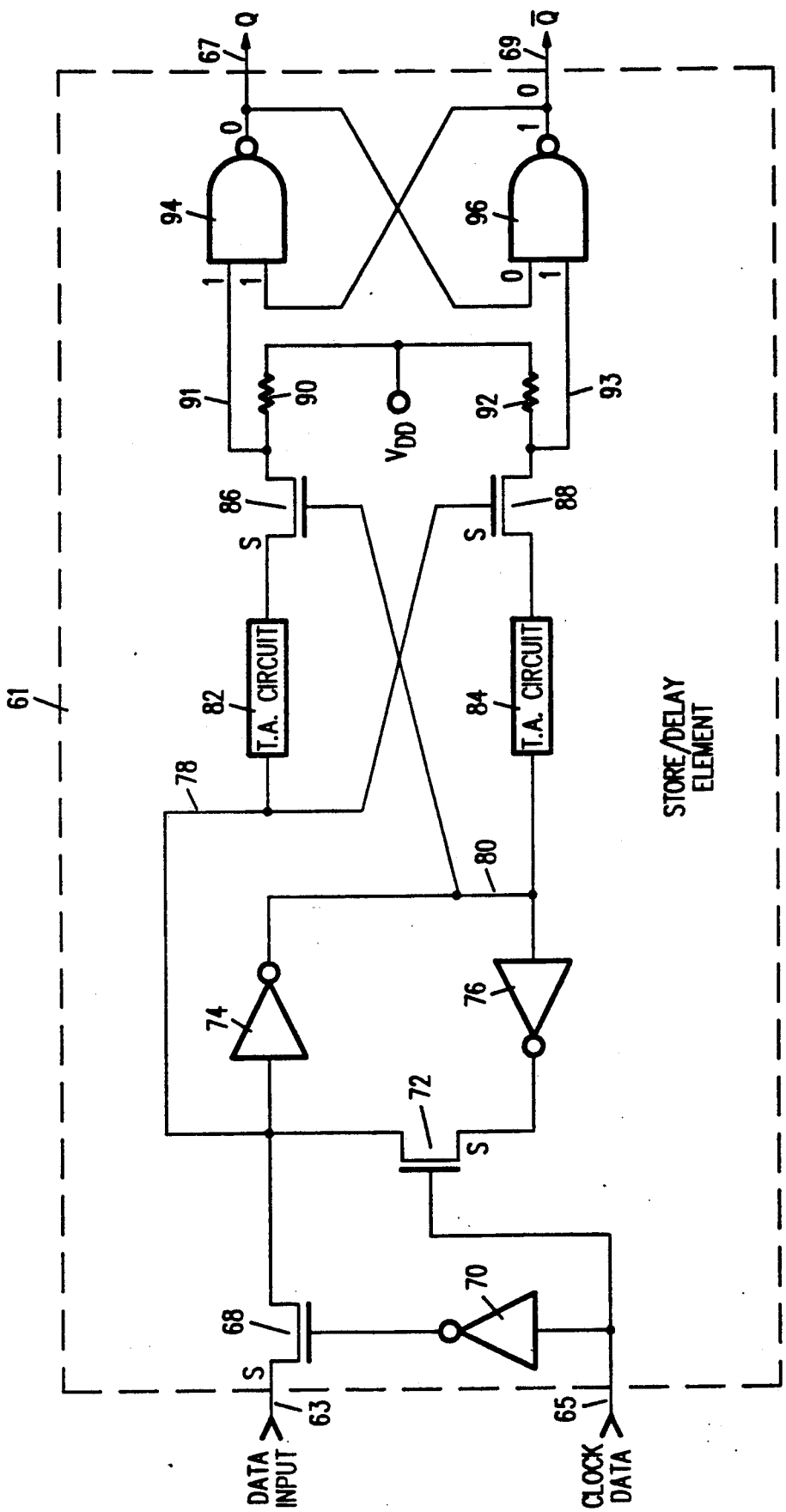
FIG. 5 is a detailed schematic diagram of a latch circuit which can be used for synchronizing signals and which eliminates errors due to intenal metastable conditions.

FIG. 5 is a schematic diagram of a latch circuit 61 which eliminates errors due to internal metastable conditions and which can be used for sampling or synchronizing signals. The latch circuit 61 is a D-type latch having a data input (D input) on line 63 and a clock input on line 65. Latch 61 includes an input latch stage comprising components 68, 70, 72, 74 and 76 which form a conventional D-type internal latch. Latch 61 further includes an output latch stage comprising gates 94 and 96. The remaining components intermediate the input latch stage and the output latch stage function to detect when the input latch stage is in a metastable state, as will be explained.

The data input signal on line 63 is connected to the source electrode of an N channel MOS transistor 68 and the drain electrode of the transistor is connected to the input of a conventional inverter circuit 74. The output of inverter 74 is connected to the input of a second inverter 76 and the output of inverter 76 is connected to the source electrode of a second N channel MOS transistor 72.

The clock signal on line 65 is connected directly to the gate electrode of transistor 72 and to the gate electrode of transistor 68 by way of an inverter circuit 70. Accordingly, when one of either transistors 68 or 72 is conductive, the other is turned off. The latch has one output on line 78, which is connected to the node between transistor 68 and inverter 74, and a second output on line 80 which is connected to the node between the output and input of the inverters 74 and 76, respectively.

The operation of the input latch stage will now be described. When the normally low clock signal is low, transistor 68 is conductive and passes the data input signal on line 63 to the input of inverter 74. The output of inverter 76 also goes low due to the double inversion of inverters 74 and 76. However, transistor 72 is turned off, therefore the output of inverter 76 is effectively disconnected from the circuit. When the clock signal goes high, transistor 68 is turned off and transistor 72 is turned on. This causes the data input signal on line 63 to be isolated from the input to inverter 74 on line 78 and also causes the output of inverter 76 to be connected to the input of inverter 74 by way of pass transistor 72. The signal on line 78 is therefore inverted twice and fed back to itself through transistor 72. Thus, the state of the data input signal on line 63 at the time the clock signal went high is held on line 72 and the complement of the signal is held on line 80.

If the data input signal on line 63 is a logic low just before and after the clock signal is produced, the low signal is initially transferred by transistor 68 to the input of inverter 74. When the clock signal goes high, transistor 68 is turned off thereby isolating the latch from the input. Transistor 72 is turned on thereby transferring the low output of inverter 76 to the input of inverter 74 so as to store the logic low signal. The output on line 78 will then be a logic low and the output on line 80 will be a logic high.

The outputs on line 78 and 80 of the latch are coupled to the circuitry for detecting when the input latch stage is metastable. The output on line 78 is connected to the input of a threshold adjustment circuit 82 which becomes conductive when the voltage across the circuit exceeds a predetermined value. Circuit 82 can be implemented utilizing an N channel MOS transistor, such as a transistor 48 shown in FIG. 3. The function of the threshold adjustment circuit 82 is to remain non-conductive when a voltage is applied across the circuit which is less than a predetermined value and to commence conducting when the applied voltage exceeds the predetermined value. Accordingly, other circuit components such as a zener diode can be used for this application.

The output of the threshold adjustment circuit 82 is connected to the source electrode of an N channel MOS transistor 86. The gate electrode of transistor 86 is connected to the second output of the input latch stage on line 80. The drain electrode of transistor 86 is connected to the positive supply voltage $V_{DD}$ through a resistor 90 and to one input of the NAND gate 94 by way of line 91. As priviously noted, gate 94, together with gate 96, form the output latch stage. Voltage $V_{DD}$ is typically +5 volts. The remaining input of NAND gate 94 is connected to the output of the second NAND gate 96.

The second output of the input latch stage on line 80 is connected to the input of a second threshold adjustment circuit 84, similar to circuit 82. The output of circuit 84 is connected to the source electrode of transistor 88 and the gate electrode of transistor 88 is connected to the first output of the input storage element on line 78.

The drain electrode of transistor 88 is connected to the positive supply voltage $V_{DD}$ by way of a resistor 92 and to one input of NAND gate 96 by way of line 93. The remaining input of gate 96 is connected to the output of gate 94. The outputs of cross-coupled gates 94 and 96, which comprise the output latch stage, form the complementary Q and $\overline{Q}$ outputs on lines 67 and 69, respectively, of the overall latch circuit 61.

In normal operation, the outputs of the input latch stage on lines 78 and 80 are complementary, with one output at a logic low level and the other output at a logic high level. For a +5 volt supply voltage, the difference in magnitude is approximately 4.5 volts.

Assuming that the data input signal was a high logic level when the clock signal was produced, the input latch stage output on line 78 will be high and will exceed the low logic output on the second latch output on line 80 by approximately 4.5 volts. The sum of the threshold voltage of device 82 and the threshold voltage of transistor 86 is preferably set to a value selected to exceed the logic threshold voltage of inverter 74, which is approximately one-half the supply voltage or approximately 2.5 volts. The voltage is also selected to be less than the nominal voltage difference between the latch output voltages on lines 78 and 80. The higher the selected total threshold voltage, the greater the propagation delay through the overall latch circuit 61. Also, the higher the selected total threshold voltage, the lower the probability of latch circuit 61 becoming metastable.

Assuming that the input latch stage is not metastable, the nominal high level logic voltage on latch output line 80 will exceed the nominal low level logic voltage on line 78 by more than 4 volts. Accordingly, the high voltage applied to the gate of transistor 86 and the low voltage applied to the terminal of the threshold adjustment circuit 82 will cause both devices to become conductive. Accordingly, the voltage on line 91 connected to the drain of transistor 86 will be pulled down to a low logic level.

For the same input latch stage output voltages, transistor 88 will be turned off, since the gate of the transistor will be at a low voltage. Accordingly, the drain electrode of transistor 88 connected to line 93 will be pulled up to a logic high level by pull-up resistor 92.

Since the input to the output latch stage on line 91 is a logic low, the output of NAND gate 94 is forced to a high logic voltage, independent of the second gate input logic level. Since both inputs to NAND gate 96 are a logic high, the output of gate 96 is forced to a low logic level. Thus, the data input signal on line 63 is transfered to the Q output on line 67. Further, the inverted output $\overline{Q}$ on line 67 is the compliment of the Q output.

If the data input signal is at a low logic level when the clock signal is produced, transistors 86 and 88 will be conductive and non-conductive, respectively. The Q output on line 67 will be latched at a logic low level and the $\overline{Q}$ output on line 69 will be the complement.

Should the data input signal be changing states when the clock signal is received, there is an increased probability that the input latch stage will become metastable. In that event, the outputs on lines 78 and 80 will both remain near the logic threshold of the device of approximately 2.5 volts. Alternatively, it is possible that one of the latch outputs will remain at the logic threshold level and the other output will oscillate between high and low logic levels. In neither case, however, will there be a difference voltage between the latch output lines 78 and 80 having a magnitude which exceeds approximately 2.5 volts. There will, therefore, be insufficient voltage to turn on either one of transistors 86 or 88. With both transistors 86 and 88 turned off, the voltages on lines 91 and 93 will both be at a high logic level.

Accordingly, the output latch stage will remain unchanged and the Q and $\overline{Q}$ outputs will be held at the previous values. Eventually, the output latch stage will be updated to reflect the new value of the data input signal.

Figure 1:
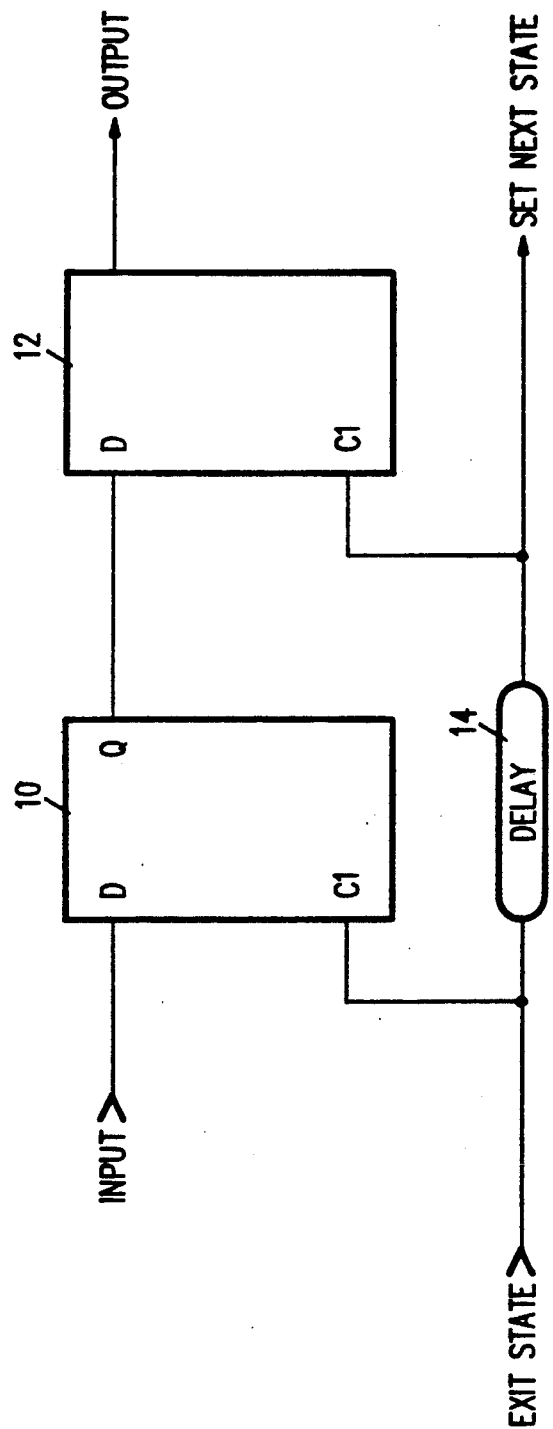
FIG. 1 depicts a conventional circuit for synchronizing a digital input signal using an asynchronous strobe signal.

It can be seen that the FIG. 5 latch circuit is superior to the FIG. 1 prior art circuit in that there is no delay (other than ordinary propogation delay) unless the input latch stage becomes metastable. Further, any delay produced will exactly match the period that the input latch stage is metastable.

Thus, various embodiments of the present invention have been disclosed. Although the embodiments have been described in some detail, it is to be understood that various changes in the invention could be made by those skilled in the art without departing from the spirit and scope of the invention as defined by the appended claims.

I claim:

1. A synchronization circuit for synchronizing a plurality of input signals with a strobe signal which is asynchronous with respect to the input signals, said synchronization circuit comprising:
   store/delay circuit means associated with each of the input signals, with each of the store/delay circuit means including
   (a) storage circuit means for storing an output signal indicative of the associated input signal in response to said strobe signal, said storage circuit means changeable between a stable and a metastable state;
   (b) detect means for detecting when the storage circuit means is in said stable state; and
   gate means coupled to an output of each detect means for producing a synchronized signal which is synchronized with respect to the strobe signal only when the storage circuit means of all of said store/delay circuit means is in said stable state.

2. The circuit of claim 1 wherein said store/delay circuit means includes first and second outputs which differ in magnitude by a predetermined amount when said associated storage circuit means is in said stable state and wherein said detect means is responsive to said first and second outputs.

3. The circuit of claim 2 wherein said store/delay circuit means includes first and second cross-coupled logic elements and said associated input signal is coupled to an input of said first logic element and said strobe signal is coupled to an input of said second logic element.

4. The circuit of claim 3 wherein said detect means includes first and second cross-coupled field effect transistors each having source, drain and gate electrodes, with the source and gate electrodes of said first transistor coupled to the outputs of said first and second logic elements, respectively, and with the source and gate electrodes of said second transistor coupled to the outputs of said second and first logic elements, respectively.

5. The circuit of claim 4 wherein said detect means further includes third and fourth field effect transistors, each having source, drain and gate electrodes with said first transistor coupled to the output of said first logic element by way of said third transistor, with the source and drain electrodes of said third transistor coupled to the output of said first logic element and to the source electrode of said first transistor, respectively, and with said second transistor coupled to the output of said second logic element by way of said fourth transistor, with the source and drain elements of said fourth transistor coupled to the output of said second logic element and to the source electrode of said second transistor, respectively.

6. The circuit of claim 5 wherein the gate electrode of said third transistor is coupled to the drain electrode of said third transistor and the gate electrode of said fourth transistor is coupled to the drain electrode of said fourth transistor.

7. The circuit of claim 1 wherein said store/delay circuit means includes two outputs, one of which carries said output signal, and said detect means is responsive to a difference in magnitude of signals at said two outputs.

8. The circuit of claim 7 wherein said detect means includes first and second field effect transistors each having a predetermined threshold voltage and wherein said difference in magnitude is a function of said threshold voltage.

9. A synchronization circuit for synchronizing a plurality of input signals utilizing a synchronous strobe signal, said circuit comprising:
   a separate storage circuit means associated with each of the plurality of input signals with each said storage circuit means being a means for storing a first output signal indicative of said associated input signal in response to said strobe signal, said storage circuit means changeable between a stable and a metastable state;
   a separate detect means associated with each of said storage circuit means, with each of said detect means being a means for detecting when said associated storage circuit is in said stable state; and
   gate means coupled to an output of each detect means for producing synchronized output signals from the storage circuit means first output signals in response to said strobe signal when all of said storage circuit means are in said stable state.

10. The circuit of claim 9 wherein each of said storage circuit means also stores a second output signal which is the complement of said first output signal except when said storage circuit means is in said metastable state and wherein each of said detect means detects said stable state of said associated bistable circuit means by comparing said first and second output signals.

11. A method of synchronizing a plurality of input signals with a strobe signal which is asynchronous with respect to the input signals, said method comprising the following steps:
   storing each of the input signals in separate storage circuits in the form of output signals;
   detecting when any of the storage circuits are in a metastable or stable state;
   producing a synchronized signal which is synchronized with respect to the strobe signal only when all of the storage circuits are in the stable state.

12. The method of claim 11 wherein the storage circuit includes a first output which outputs the output signal and a second output which outputs a second output signal which is the complement of said first output signal when the bistable circuit is in the stable state.

13. The method of claim 12 wherein said step of detecting is carried out by comparing said first and second output signals.

14. A synchronization circuit for synchronizing an input signal with respect to a strobe signal which is asynchronous with respect to the input signal, said synchronization circuit comprising:
   storage circuit means for storing an output signal indicative of said input signal in response to said strobe signal, said storage circuit means changeable between a stable and a metastable state and including first and second cross-coupled logic elements, with said input signal being coupled to an input of said first logic element and said strobe signal being coupled an input of said second logic element and with said storage circuit means including first and second outputs which differ in magnitude by a predetermined amount when said storage circuit means is in said stable state;
   detect means for detecting when said storage circuit means is in said stable state, with said detect means including first and second cross-coupled field effect transistors each having source, drain and gate electrodes, with the source and gate electrodes of the first transistor coupled to the outputs of said first and second logic elements, respectively, and with the source and gate electrodes of said second transistor coupled to the outputs of the second and first logic elements, respectively, and with said detect means further including third and fourth field effect transistors, each having source, drain and gate electrodes, with the first transistor coupled to the output of the first logic element by way of said third transistor, with the source and drain electrodes of said third transistor coupled to the output of said first logic element and to the source electrode of said first transistor, respectively, and with said second transistor coupled to the output of said second logic element by way of said fourth transistor, with the source and drain electrodes of said fourth transistor coupled to the output of said second logic element and to the source electrode of said second transistor, respectively;
   gate means coupled to said detect means for producing a synchronized signal which is synchronized with respect to the strobe signal only when the storage circuit means is in the stable state.

15. The circuit of claim 14 wherein the gate electrode of said third transistor is coupled to the drain electrode of said third transistor and the gate electrode of said fourth transistor is coupled to the drain electrode of said fourth transistor.

* * * * *